United States Patent
Yoo et al.

(10) Patent No.: US 7,022,599 B2
(45) Date of Patent: Apr. 4, 2006

(54) METHOD OF MANUFACTURING SEMICONDUCTOR DEVICES

(75) Inventors: Kyong Sik Yoo, Seoul (KR); Sung Ki Park, Kyungki-Do (KR)

(73) Assignee: Hynix Semiconductor Inc., Kyungki-do (KR)

( * ) Notice: Subject to any disclaimer, the term of this patent is extended or adjusted under 35 U.S.C. 154(b) by 57 days.

(21) Appl. No.: 10/306,335

(22) Filed: Nov. 27, 2002

(65) Prior Publication Data

US 2003/0119302 A1 Jun. 26, 2003

(30) Foreign Application Priority Data

Dec. 20, 2001 (KR) ........................ 2001-81929

(51) Int. Cl.
*H01L 21/4763* (2006.01)

(52) U.S. Cl. .................................................. 438/622
(58) Field of Classification Search ............... 438/791, 438/675, 622, 587, 396, 253, 240, 778, 637, 438/197, 238, 239, 256, 623, 624, 627, 631
See application file for complete search history.

(56) References Cited

U.S. PATENT DOCUMENTS

| | | | |
|---|---|---|---|
| 5,710,079 A * | 1/1998 | Sukharev | 438/778 |
| 5,728,618 A | 3/1998 | Tseng | |
| 5,766,994 A | 6/1998 | Tseng | |
| 5,851,867 A | 12/1998 | Chen et al. | |
| 5,960,279 A * | 9/1999 | Chen et al. | 438/253 |
| 6,071,789 A | 6/2000 | Yang et al. | |
| 6,084,261 A | 7/2000 | Wu | |
| 6,140,178 A | 10/2000 | Tseng | |
| 6,162,681 A | 12/2000 | Wu | |
| 6,184,551 B1 | 2/2001 | Lee et al. | |
| 6,218,283 B1 | 4/2001 | Park et al. | |
| 6,503,829 B1 * | 1/2003 | Kim et al. | 438/637 |

FOREIGN PATENT DOCUMENTS

KR   1998-056191   9/1998

OTHER PUBLICATIONS

Office Action from the Taiwan Intellectual Property Office dated Apr. 19, 2005 (5 pages).
Office Action from Korean Intellectual Property Office dated Oct. 2, 2003 (2 pages).

* cited by examiner

*Primary Examiner*—Craig A. Thompson
*Assistant Examiner*—Monica D. Harrison
(74) *Attorney, Agent, or Firm*—Marshall, Gerstein & Borun LLP

(57) ABSTRACT

A method of manufacturing a semiconductor device is disclosed. The method includes depositing an $O_3$-TEOS oxide film having a good flow-like property under a high adhesive force in order to prevent degradation in the characteristic of the surface of a lower insulating film made of a PE-TEOS oxide film and generation of defect due to the topology difference. Therefore, the disclosed method can improve the electrical characteristic of a semiconductor device and the manufacturing yield.

13 Claims, 3 Drawing Sheets

METHOD OF MANUFACTURING SEMICONDUCTOR DEVICES

BACKGROUND

1. Technical Field

Methods of manufacturing semiconductor devices, and more particularly methods of manufacturing semiconductor devices having an interlayer insulating film in which oxide films are stacked are disclosed.

2. Description of the Related Art

Generally, semiconductor memory devices include a memory cell array having a plurality of memory cells, and peripheral circuits for storing information on the memory cell or reading the stored information.

In the process of manufacturing the semiconductor devices, the memory cell array and the peripheral circuits are formed on a semiconductor substrate in different regions. As the degree of integration of the device is increased, however, various defects can occur due to topology differences between the memory cell region and the peripheral circuit region.

FIGS. 1A through 1C are cross-sectional views of conventional semiconductor devices for explaining a method of manufacturing a DRAM.

Referring now to FIG. 1A, a gate oxide film 2 and a gate electrode 3, which form a stacked structure, are formed on a semiconductor substrate 1. Junction regions 4 are formed in the semiconductor substrate 1 at both sides of the gate electrode 3, thus completing a transistor. The process of manufacturing the transistor is performed simultaneously at a memory cell region C and a peripheral circuit region P in the semiconductor substrate 1.

Next, a first insulating film 5 is formed on the entire structure and the first insulating film 5 is patterned so that the junction region 4 at one portion can be exposed. Thereafter, a bit line 6 is formed on the first insulating film 5 so that the bit line 6 can be connected to the exposed junction region 4. Next, a second insulating film 7 is formed on the entire structure, and the second and first insulating films 7 and 5 are then sequentially patterned so that the junction region 4 at the other portion can be exposed, thus forming a contact hole. Then, a plug 8 is formed within the contact hole.

Referring now to FIG. 1B, a third insulating film 9 is formed on the second insulating film 7 including the plug 8. Then, the third insulating film 9 is patterned to expose the plug 8. Next, a lower electrode 10 of a capacitor is formed on the third insulating film 9 so that the lower electrode 10 can be connected to the plug 8. At this time, the third insulating film 9 is made of a PE-TEOS oxide film.

By reference to FIG. 1C, a dielectric film 11 and an upper electrode 12 are sequentially formed on the third insulating film 9 including the lower electrode 10 and are then patterned to complete the capacitor. At this time, as the wet etch rate of the PE-TEOS oxide film 9 is slow, the third insulating film 9 in the peripheral circuit region P remains. Therefore, the topology difference between the cell region C and the peripheral circuit region P needs to be decreased.

Thereafter, a fourth insulating film 13 is formed on the entire structure. Then, the fourth, third, second and first insulating films 13, 9, 7 and 5 are sequentially patterned to form a contact hole 14 so that a given portion of the gate electrode 3 in the peripheral circuit region P can be exposed. Next, a metal wire (not shown) is formed on the fourth insulating film 13 so that the metal wire can be connected to the gate electrode 3 via a contact hole 14. At this time, the fourth insulating film 13 is also made of a PE-TEOS oxide film.

However, in the above conventional process, the topology angle at the boundary of the memory cell region C and the peripheral circuit region P becomes about 45° due to the height of the upper electrode 12 in the capacitor. Therefore, as the topology difference is reflected on the surface of the fourth insulating film 13 made of the PE-TEOS oxide film, a conductive material may remain or defects can occur in the lithography process and etch process for forming the metal wire when the plug for connecting with a subsequent metal wire is formed. Thus, a bridge, etc. is generated and contact between the metal wires or defects in the wire may be caused.

Further, as the upper electrode 12 is formed with the third insulating film 9 in the peripheral circuit region P exposed, the surface state of the third insulating film 9 becomes rough through various processes (lithograph process, etch process, etc.), thus degrading an interface characteristic with the fourth insulating film 13. Therefore, in a cleaning process that is performed after the contact hole 14 is formed, an etch agent penetrates into the interface of the third and fourth insulating films 9 and 13, so that an etch portion A of an undesired ring shape is formed. As a result, connection to a neighboring contact hole is made difficult because of the bridge or poor step coverage of a barrier metal layer (Ti/TiN) in the contact hole 14 as a result of the deformity shown at A.

Meanwhile, after the fourth insulating film 13 is formed, a rapid thermal annealing (RTA) or a tube annealing for activating the upper electrode 12 is performed at the temperature of 800° C. However, this has no significant effect on reduction in the topology difference of the PE-TEOS oxide film surface or an increase in the adhesive force between the PE-TEOS oxide films.

SUMMARY OF THE DISCLOSURE

To solve the above problems, a method of manufacturing a semiconductor device is disclosed in which an $O_3$-TEOS oxide film having a flow-like property and an adhesive force is formed on an insulating film made of a PE-TEOS oxide film.

A disclosed method is characterized in that it comprises the steps of forming a insulating film on a semiconductor substrate, forming a conductive layer pattern on the insulating film, and forming an $O_3$-TEOS oxide film on the entire structure including the conductive layer pattern and the insulating film.

BRIEF DESCRIPTION OF THE DRAWINGS

The aforementioned aspects and other features of the disclosed methods will be explained in the following description, taken in conjunction with the accompanying drawings, wherein.

DETAILED DESCRIPTION OF THE PREFERRED EMBODIMENTS

Figure 1A:
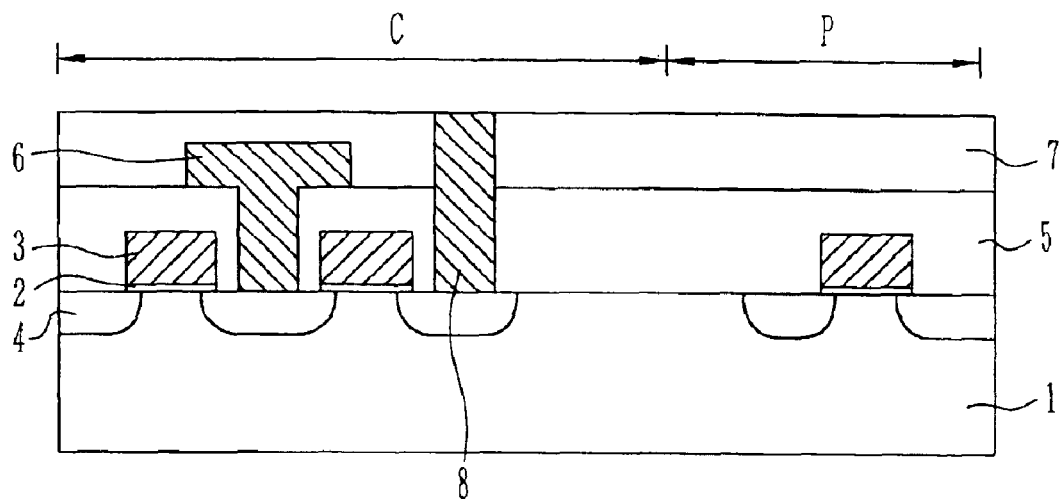
FIGS. 1A through 1C are cross-sectional views of conventional semiconductor devices for explaining the conventional method of manufacturing the semiconductor devices.
Figure 1B:
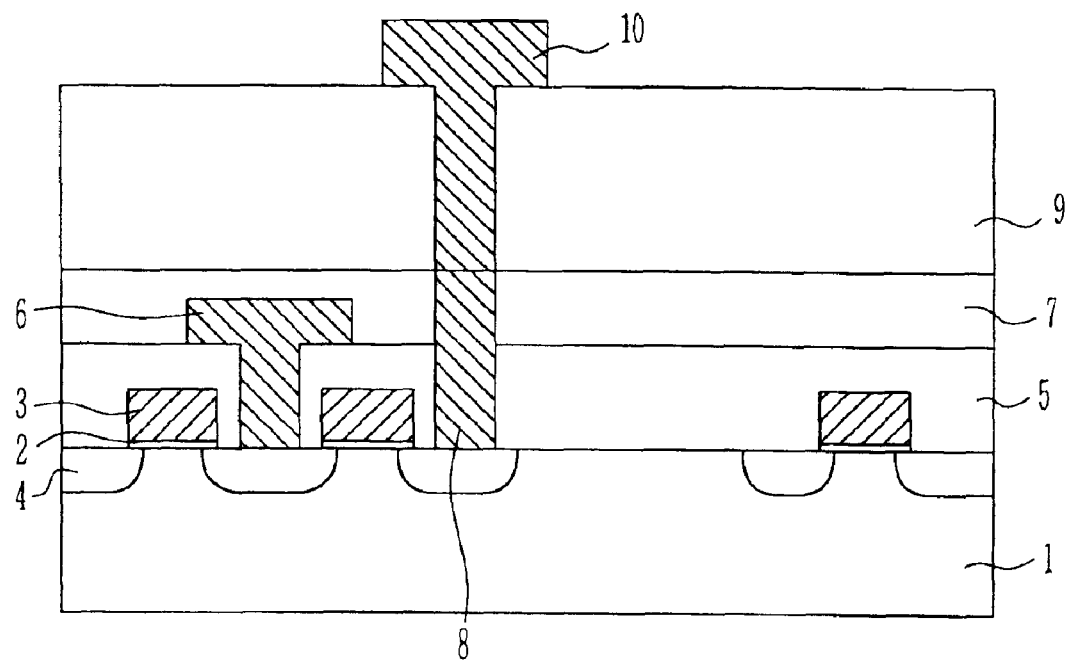
Figure 1C:
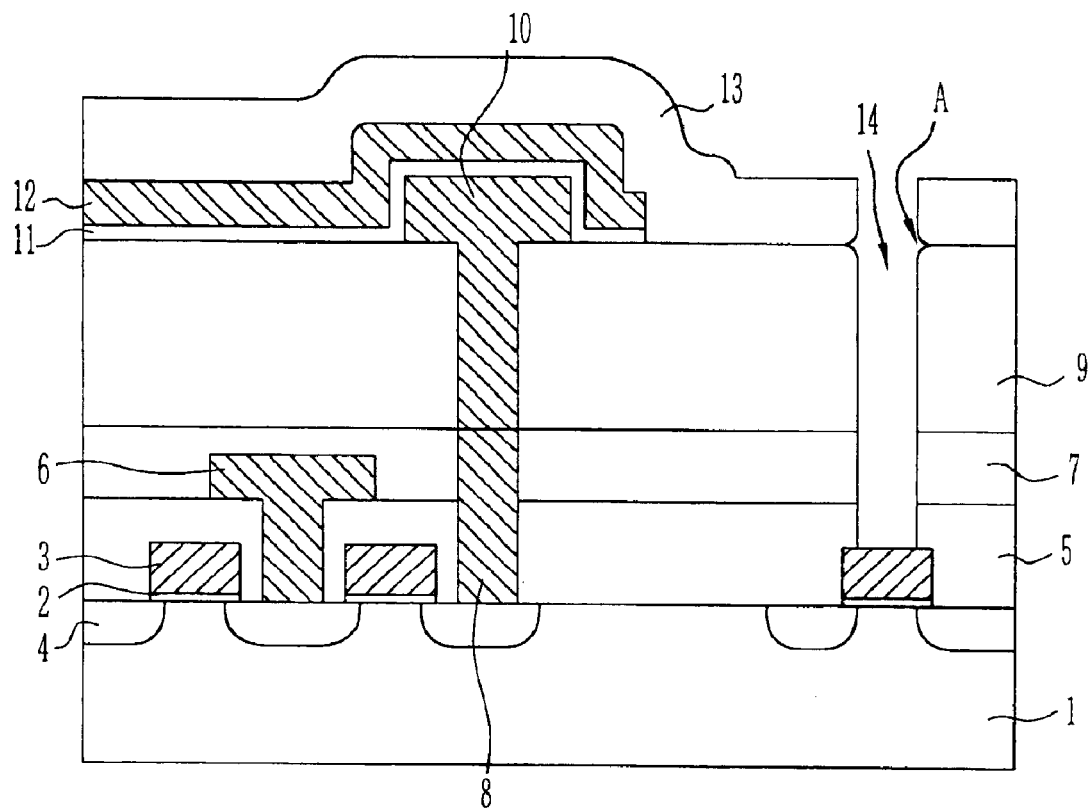
Figure 2A:
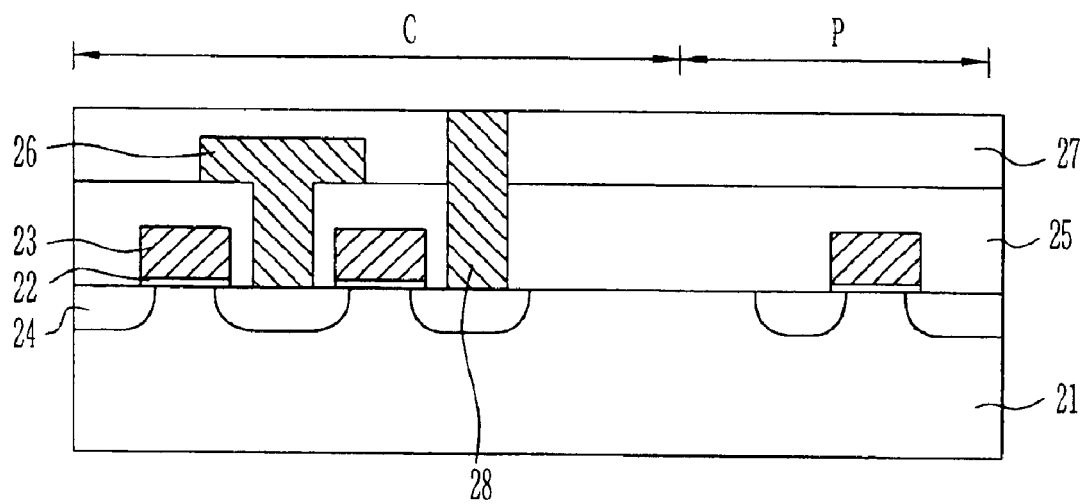
FIGS. 2A through 2C are cross-sectional views of semiconductor devices for explaining a disclosed method of manufacturing the semiconductor devices.
Figure 2B:
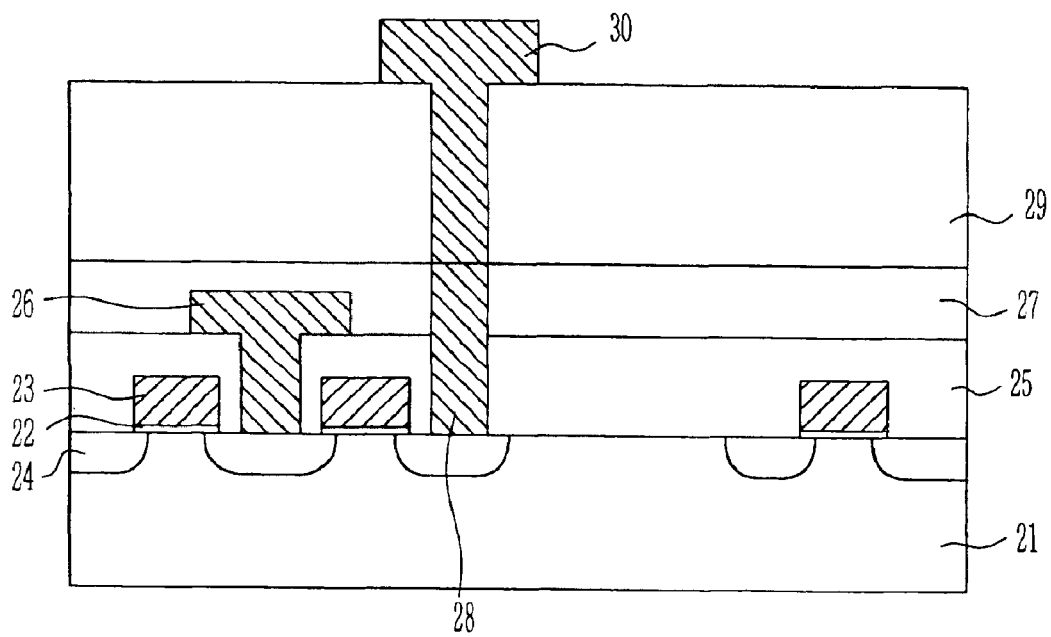
Figure 2C:
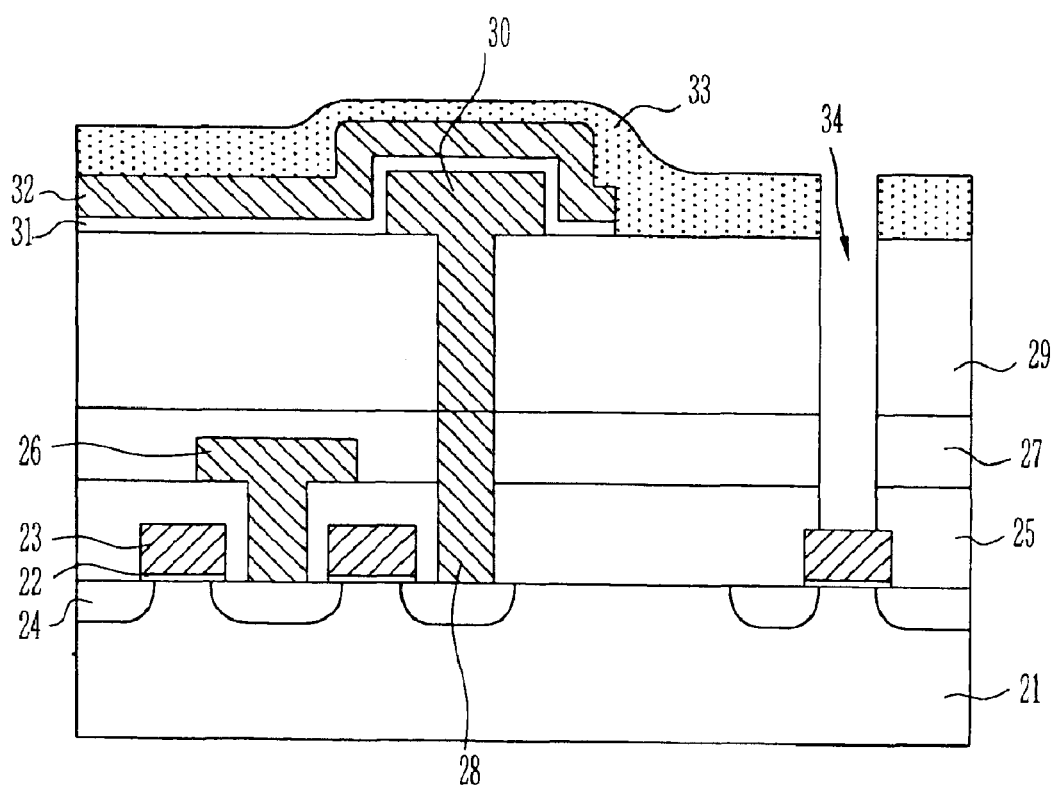

FIGS. 2A through 2C are cross-sectional views of semiconductor devices for explaining a disclosed method of manufacturing the semiconductor devices which includes a method of manufacturing a DRAM.

Referring now to FIG. 2A, a gate oxide film 22 and a gate electrode 23, which form a stacked structure, are formed on a semiconductor substrate 21. Junction regions 24 are formed in the semiconductor substrate 21 at both sides of the gate electrode 23, thus completing a transistor. The method of manufacturing the transistor is performed simultaneously at a memory cell region C and a peripheral circuit region P in the semiconductor substrate 21.

Next, a first insulating film 25 is formed on the entire structure and the first insulating film 25 is patterned so that the junction region 24 at one portion can be exposed. Thereafter, a bit line 26 is formed on the first insulating film 25 so that the bit line 26 can be connected to the exposed junction region 24. Next, a second insulating film 27 is formed on the entire structure, and the second and first insulating films 27 and 25 are then sequentially patterned so that the junction region 24 at the other portion can be exposed, thus forming a contact hole. Then, a plug 28 is formed within the contact hole.

Referring now to FIG. 2B, a third insulating film 29 is formed on the second insulating film 27 including the plug 28. Then, the third insulating film 29 is patterned to expose the plug 28. Next, a lower electrode 30 of a capacitor is formed on the third insulating film 29 so that the lower electrode 20 can be connected to the plug 28. At this time, the third insulating film 29 is made of a PE-TEOS oxide film.

By reference to FIG. 2C, a dielectric film 31 and an upper electrode 32 are sequentially formed on the third insulating film 29 including the lower electrode 30 and are then patterned to complete the capacitor. At this time, as the wet etch rate of the PE-TEOS oxide film is late, the third insulating film 29 in the peripheral circuit region P remains. Therefore, the topology difference between the cell region C and the peripheral circuit region P can be decreased.

Thereafter, a fourth insulating film 33 is formed on the entire structure. Then, the fourth, third, second and first insulating films 33, 29, 27 and 25 are sequentially patterned to form a contact hole 34 so that a given portion of the gate electrode 23 in the peripheral circuit region P can be exposed. Next, a metal wire (not shown) is formed on the fourth insulating film 33 so that the metal wire can be connected to the gate electrode 23 via a contact hole 34. At this time, it is preferred that the fourth insulating film 33 be made of an $O_3$-TEOS oxide film.

The $O_3$-TEOS oxide film having a good native flow-like property is deposited in thickness of greater than about 2500 Å, preferably ranging from about 2500 to about 5000 Å at a temperature ranging from about 500 to about 550° C., so that the dependency against an underlying film can be prohibited. Further, upon deposition, the density of $O_3$ is controlled to be greater than about 135 $g/m^3$, preferably ranging from about 135 to about 180 $g/m^3$.

As above, as the fourth insulating film 33 is made of the $O_3$-TEOS oxide film, the topology difference at the boundary of the memory cell region C and the peripheral circuit region P is reduced due to a good flow-like property. Further, the topology angle is reduced to be about 35° compared to a conventional technology. In addition, as the deposition temperature of the $O_3$-TEOS oxide film is high, an interfacial contact with the third insulating film 29 becomes good. Therefore, in a cleaning process that is performed after the contact hole 34 is formed, an etch portion of a ring shape is not created.

Also, impurities contained in the $O_3$-TEOS oxide film can be removed by performing a rapid thermal annealing (RTA) or a tube annealing for activating the upper electrode 32 at a temperature ranging from about 750 to about 1000° C. for a time period ranging from about 20 seconds to about 30 minutes, after the $O_3$-TEOS oxide film is formed. Due to this, a stable film structure can be obtained.

Table 1 illustrates the yield and defective ratio in a case that the present invention is applied in a process of manufacturing a semiconductor device having the line width of 0.16 Å. It is confirmed that the present process using the PE-TEOS oxide film and the $O_3$-TEOS oxide film could obtains a better result than a conventional one, as a result of analyzing defect items that can be generated by a contact between the metal wires due to generation of the bridge.

TABLE 1

| Insulating Film | Repairable Die (REP) | | Leakage Current (LKG) | | Operating Current (ICC) | | Standby Current (ICC2) | | Defective Ratio | |
|---|---|---|---|---|---|---|---|---|---|---|
| | ea/wf | %/wf | ea/wf | %/wf | ea/wf | %/wf | ea/wf | %/wf | ea/wf | %/wf |
| PE-TEOS (15 sheets) | 1 | 1.2 | 1.4 | 1.7 | 34.2 | 41.7 | 32.9 | 40.1 | 4.1 | 5.0 |
| $O_3$-TEOS (4 sheets) | 6 | 7.3 | 1.5 | 1.8 | 27.5 | 33.5 | 26.5 | 32.3 | 3.3 | 4.0 |

In the Table 1, the repairable die (REP) indicates one that can be operated through change in the circuit though the die does not operate due to wrong process. At this time, then leakage current (LKG) indicates a current flowing into the substrate, the operating current (ICC) indicates a current flowing into the metal wires when the circuit is driven, and the standby current (ICC2) indicates a current flowing into the metal wires before the circuit is driven.

While the current flowing into the substrate and the metal wires is limited, an undesired current may flow into the metal wires due to a process problem, for example the bridge between the wires. Though there may be various process problems, what is evident is that the disclosed method provides a metal wire process after the $O_3$-TEOS oxide film is formed If the $O_3$-TEOS oxide film does not have a native flow-like property or the surface of it is not smooth, shortage may be caused in a subsequent metal wire etching process, so that excessive operating current or standby current may flow. Therefore, as a result of measuring how many defective dies are, it is determined that the disclosed method has an improved effect, as can be seen from Table 1. In other words, as the topology angle is reduced since O3-TEOS is used, minute shortage between the metal wires can be effectively prevented.

As mentioned above, the disclosed method includes forming an insulating film using an O3-TEOS oxide film having a good flow-like property and an adhesive force on an insulating film made of a PE-TEOS oxide film. Therefore, the disclosed method can obtains the following advantages:

First, as the topology difference at the boundary of the memory cell region and the peripheral circuit region is reduced, a subsequent process can be easily performed and defects can be prevented.

Second, as the $O_3$-TEOS oxide film is deposited under the condition that dependency against an underlying film is low in order to increase the adhesive force, the interfacial contact with the PE-TEOS oxide film the surface of which is poor. Thus, penetration of an etchant into the interface when the contact hole is cleaned can be prevented.

Third, as the impurity contained in the $O_3$-TEOS oxide film is removed by a subsequent process, a stable film structure can be obtained to improve an electrical characteristic of the film.

Fourth, because the deposition speed of the $O_3$-TEOS oxide film is faster than that of the PE-TEOS oxide film is used, the yield can be improved.

Fifth, a dedicated deposition equipment is required in order to deposit the PE-TEOS oxide film. However, as the $O_3$-TEOS oxide film can be deposited by existing $O_3$-BPSG deposition equipment, additional costs can be reduced.

The disclosed method and variations thereof have been described with reference to a particular embodiment in connection with a particular application. Those having ordinary skill in the art and access to the teachings of this disclosure will recognize additional modifications and applications within the scope thereof. It is therefore intended by the appended claims to cover any and all such applications, modifications, and embodiments within the scope of this disclosure.

What is claimed is:

1. A method of manufacturing a semiconductor device comprising:
   forming a insulating film on a semiconductor substrate;
   forming a conductive layer pattern on the insulating film leaving a portion of the insulating film exposed;
   forming an $O_3$-TEOS oxide film on the conductive layer pattern and the insulating film; and
   wherein said $O_3$-TEOS oxide film is deposited in thickness ranging from about 2500 to about 5000 Å and at a temperature ranging from abort 500 to 550° C.

2. The method as claimed in claim 1, wherein said insulating film is a PE-TEOS oxide film.

3. The method as claimed in claim 1, wherein a density of $O_3$ ranges from about 135 to about 180 g/m³ during the deposition of said $O_3$-TEOS oxide film.

4. The method as claimed in claim 1, further comprising performing an annealing process after the step of forming said $O_3$-TEOS oxide film.

5. The method as claimed in claim 4, wherein said annealing process is performed at a temperature ranging from about 750 to about 1000° C.

6. A method of manufacturing a semiconductor device comprising:
   forming a PE-TEOS oxide film on a semiconductor substrate in which transistors and bit lines are formed, the transistors being formed in a cell region and in a peripheral circuit region;
   forming capacitors on the PE-TEOS oxide film of the cell region; and
   forming an $O_3$-TEOS oxide film on the entire structure including the capacitors and the PE-TEOS oxide film,
   wherein said $O_3$-TEOS oxide film is deposited in thickness ranging from about 2500 to about 5000 Å at a temperature ranging from abort 500 to 550° C.

7. The method as claimed in claim 6, wherein the density of $O_3$ ranges from about 135 to about 180 g/m³ during the deposition of said $O_3$-TEOS oxide film.

8. The method as claimed in claim 6, further comprising performing an annealing process after the step of forming said $O_3$-TEOS oxide film.

9. The method as claimed in claim 8, wherein said annealing process is performed at a temperature ranging from about 750 to about 1000° C.

10. A method of manufacturing a semiconductor device comprising:
    forming a insulating film on a semiconductor substrate;
    forming a conductive layer pattern on the insulating film leaving a portion of the insulating film exposed;
    forming an $O_3$-TEOS oxide film on the conductive layer pattern and the exposed portion of the insulating film;
    wherein said $O_3$-TEOS oxide film is deposited in thickness ranging from about 2500 to about 5000 Å and at a temperature ranging from about 500 to about 550° C.; and
    wherein a density of $O_3$ ranges from about 135 to about 180 g/m³ during the deposition of said $O_3$-TEOS oxide film.

11. The method as claimed in claim 10, wherein said insulating film is a PE-TEOS oxide film.

12. The method as claimed in claim 10, further comprising performing an annealing process after the step of forming said $O_3$-TEOS oxide film.

13. The method as claimed in claim 12, wherein said annealing process is performed at a temperature ranging from about 750 to about 1000° C.

* * * * *

UNITED STATES PATENT AND TRADEMARK OFFICE
CERTIFICATE OF CORRECTION

| | | |
|---|---|---|
| PATENT NO. | : 7,022,599 B2 | Page 1 of 1 |
| APPLICATION NO. | : 10/306335 | |
| DATED | : April 4, 2006 | |
| INVENTOR(S) | : Kyong Sik Yoo et al. | |

It is certified that error appears in the above-identified patent and that said Letters Patent is hereby corrected as shown below:

Col. 5, line 45: After the phrase "and the" insert --exposed portion of the--.

Col. 5, line 48: Please delete "abort" and insert --about--.

Col. 6, line 19: Please delete "abort" and insert --about--.

Signed and Sealed this

Ninth Day of January, 2007

JON W. DUDAS
*Director of the United States Patent and Trademark Office*